(12) United States Patent
Masuda et al.

(10) Patent No.: US 8,993,440 B2
(45) Date of Patent: Mar. 31, 2015

(54) METHOD OF MANUFACTURING A SEMICONDUCTOR DEVICE WITH PROCESSES CARRIED OUT WITHOUT ATMOSPHERIC EXPOSURE

(71) Applicant: Kabushiki Kaisha Toshiba, Tokyo (JP)

(72) Inventors: Hideaki Masuda, New York City, NY (US); Kei Watanabe, Tokyo (JP); Kenichi Ootsuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/948,327

(22) Filed: Jul. 23, 2013

(65) Prior Publication Data

US 2013/0309866 A1 Nov. 21, 2013

Related U.S. Application Data

(62) Division of application No. 12/726,138, filed on Mar. 17, 2010, now abandoned.

(30) Foreign Application Priority Data

Jun. 4, 2009 (JP) .................................. 2009-135118

(51) Int. Cl.
*H01L 21/44* (2006.01)
*H01L 21/02* (2006.01)
(Continued)

(52) U.S. Cl.
CPC .... *H01L 21/02697* (2013.01); *H01L 21/02074* (2013.01); *H01L 21/02167* (2013.01); *H01L 21/02274* (2013.01); *H01L 21/02304* (2013.01);
(Continued)

(58) Field of Classification Search
USPC ........... 257/761, 632; 438/674, 695, 687, 758
See application file for complete search history.

(56) References Cited

U.S. PATENT DOCUMENTS 6,153,507 A * 11/2000 Mikagi ......................... 438/618
6,156,663 A * 12/2000 Watanabe et al. ............. 438/695
(Continued)

FOREIGN PATENT DOCUMENTS

| JP | 2007-67132 | 3/2007 |
|---|---|---|
| JP | 2007-157959 | 6/2007 |
| JP | 2007157959 A * | 6/2007 |

OTHER PUBLICATIONS

Hayashi et al., U.S. Appl. No. 12/652,204, filed Jan. 5, 2010.
Notification of Reason for Rejection issued by the Japanese Patent Office on Dec. 21, 2012, for Japanese Patent Application No. 2009-135118, and English-language translation thereof.

*Primary Examiner* — Mohammed Shamsuzzaman
(74) *Attorney, Agent, or Firm* — Finnegan, Henderson, Farabow, Garrett & Dunner, L.L.P.

(57) ABSTRACT

A method of manufacturing a semiconductor device according to an embodiment, includes forming a wiring in a surface of a first insulating film on a semiconductor substrate, exposing the first insulating film in whose surface the wiring is formed to a plasma containing a rare gas so as to form a densified layer on the surface of the first insulating film, removing an oxide film formed on the wiring, after the densified layer is formed and forming a second insulating film on the wiring from which the oxide film is removed and on the densified layer, wherein the processes from the removal of the oxide film to the formation of the second insulating film are carried out without being atmospherically-exposed.

6 Claims, 7 Drawing Sheets

(51) Int. Cl.
*H01L 21/3105* (2006.01)
*H01L 21/314* (2006.01)
*H01L 21/768* (2006.01)

(52) U.S. Cl.
CPC ...... *H01L 21/02312* (2013.01); *H01L 21/3105* (2013.01); *H01L 21/3148* (2013.01); *H01L 21/76826* (2013.01); *H01L 21/76829* (2013.01); *H01L 21/76834* (2013.01); *H01L 21/76883* (2013.01)
USPC ........... 438/674; 257/761; 257/632; 438/695; 438/687; 438/758

(56) References Cited

U.S. PATENT DOCUMENTS

| | | | |
|---|---|---|---|
| 6,319,842 B1* | 11/2001 | Khosla et al. | 438/714 |
| 7,154,179 B2 | 12/2006 | Tabuchi et al. | |
| 7,253,105 B2* | 8/2007 | Dimitrakopoulos et al. | 438/674 |
| 7,482,631 B2* | 1/2009 | Yamazaki et al. | 438/679 |
| 7,608,549 B2* | 10/2009 | Van Nooten et al. | 438/758 |
| 2006/0189133 A1* | 8/2006 | Dimitrakopoulos et al. | 438/687 |
| 2007/0048995 A1 | 3/2007 | Kawanami et al. | |

* cited by examiner

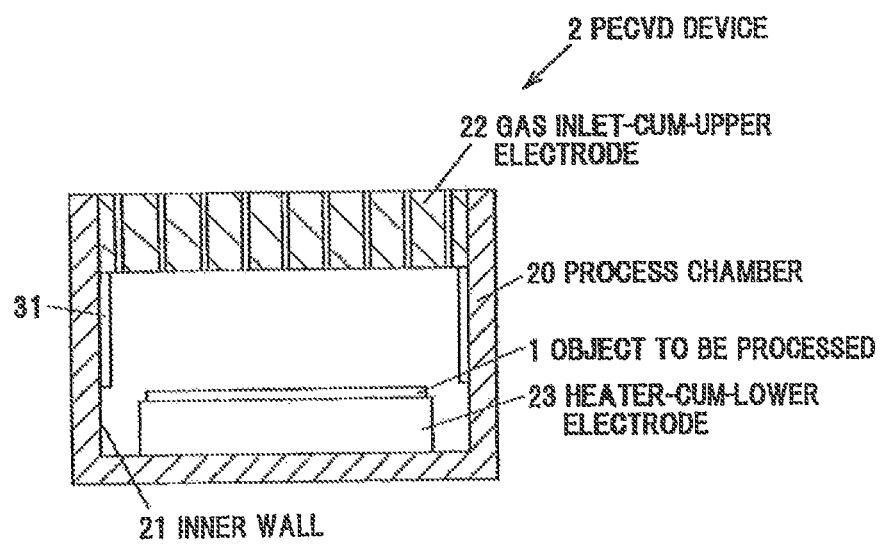

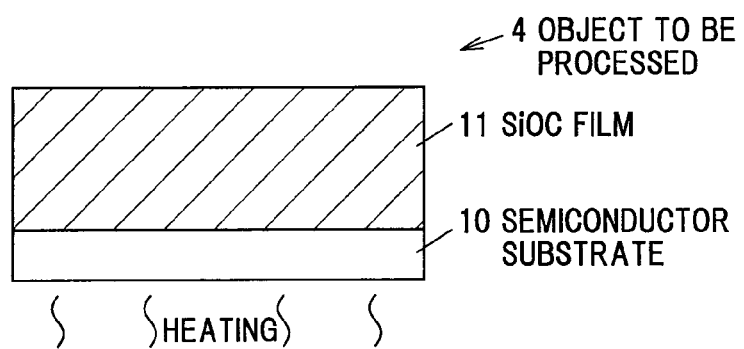
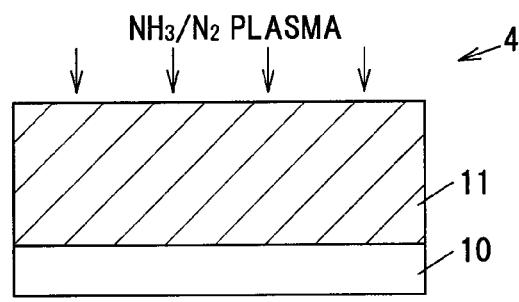

METHOD OF MANUFACTURING A SEMICONDUCTOR DEVICE WITH PROCESSES CARRIED OUT WITHOUT ATMOSPHERIC EXPOSURE

CROSS-REFERENCE TO RELATED APPLICATIONS

This is a division of Application Ser. No. 12/726,138, filed Mar. 17, 2010, which is incorporated herein by reference.

This application is based upon and claims the benefit of priority from prior Japanese Patent Application No. 2009-135118, filed on Jun. 4, 2009 the entire contents of which are incorporated herein by reference.

BACKGROUND

Recently, in order to realize a high-performance semiconductor device, techniques for reducing a wiring resistance and a capacitance between wirings have been developed, and as the technique for reducing the wiring resistance, there is a method of forming a Cu wiring by a damascene process. Also, as the technique for reducing the capacitance between wirings, a method that is capable of realizing an insulating film formed on a periphery of the Cu wiring, the insulating film having a low dielectric constant, is effective. Particularly, as the insulating film having a low dielectric constant, a porous insulating film having fine holes therein such as SiOC film is known.

Since the porous insulating film has a reduced film density so as to lower the dielectric constant, it has a disadvantage that, for example, its properties are remarkably changed when a Chemical Mechanical Polishing (CMP) process that the Cu wiring is embedded and formed in a surface of the insulating film is carried out, and then an oxide film formed on the exposed surface of the Cu wiring is removed by a plasma processing.

Consequently, as a conventional technique, a method of manufacturing a semiconductor device is proposed that an electrically conductive film is embedded in the surface of the SiOC film, and then an oxide film formed on the exposed surface of the electrically conductive film is removed by carrying out both a thermal reduction process using a reducing gas whose main component is hydrogen ($H_2$) and a plasma processing containing a reducing gas. The technique is disclosed in, for example, JP-A-2007-67132.

According to the method of manufacturing a semiconductor device, after the thermal reduction process using a reducing gas whose main component is hydrogen ($H_2$) is carried out, the plasma processing containing a reducing gas of $NH_3$ and $N_2$ is carried out, and consequently it is not needed to carry out the thermal reduction process to such an extent that the SiOC film and the electrically conductive film are damaged due to increase in heat by the above-mentioned thermal reduction process, so that the properties of SiOC film can be prevented from being changed.

However, a reduction reaction by the plasma processing containing a reducing gas acts on the surface of the electrically conductive film and simultaneously the SiOC film, and the change of properties occurs in the SiOC film, the change of properties including that Si—O—Si bonds and Si—$CH_3$ bonds are broken and a plurality of Si—H and Si—OH are formed in the SiOC film, so that a problem is caused that defective adhesion between a diffusion-preventing layer for preventing Cu contained in the electrically conductive film from being diffused and the SiOC film, and increases in capacitance between wirings and in leakage current are generated.

BRIEF SUMMARY

A method of manufacturing a semiconductor device according to an embodiment of the invention includes forming a wiring in a surface of a first insulating film on a semiconductor substrate, exposing the first insulating film in whose surface the wiring is formed to a plasma containing a rare gas so as to form a densified layer on the surface of the first insulating film, removing an oxide film formed on the wiring, after the densified layer is formed and forming a second insulating film on the wiring from which the oxide film is removed and on the densified layer, wherein the processes from the removal of the oxide film to the formation of the second insulating film are carried out without being atmospherically-exposed.

A method of manufacturing a semiconductor device according to another embodiment of the invention includes forming a wiring in a surface of a first insulating film on a semiconductor substrate, exposing the first insulating film in whose surface the wiring is formed to a plasma containing a mixed gas of a rare gas and $N_2$ gas so as to form a densified layer on the surface of the first insulating film, removing an oxide film formed on the wiring, after the densified layer is formed and forming a second insulating film on the wiring from which the oxide film is removed and the densified layer, wherein the processes from the removal of the oxide film to the formation of the second insulating film are carried out without being atmospherically-exposed.

BRIEF DESCRIPTION OF THE DRAWING

FIG. 2 is a transverse cross-sectional view schematically showing the primary portion of a PECVD (Plasma-Enhanced Chemical Vapor Deposition) device used in the method of manufacturing a semiconductor device according to the embodiment of the invention;

FIGS. 5A and 5B are transverse cross-sectional views schematically and respectively showing the primary portion of objects to be processed used in a method of manufacturing a semiconductor device according to Comparative Example;

DETAILED DESCRIPTION

[Embodiment]

Figure 1:
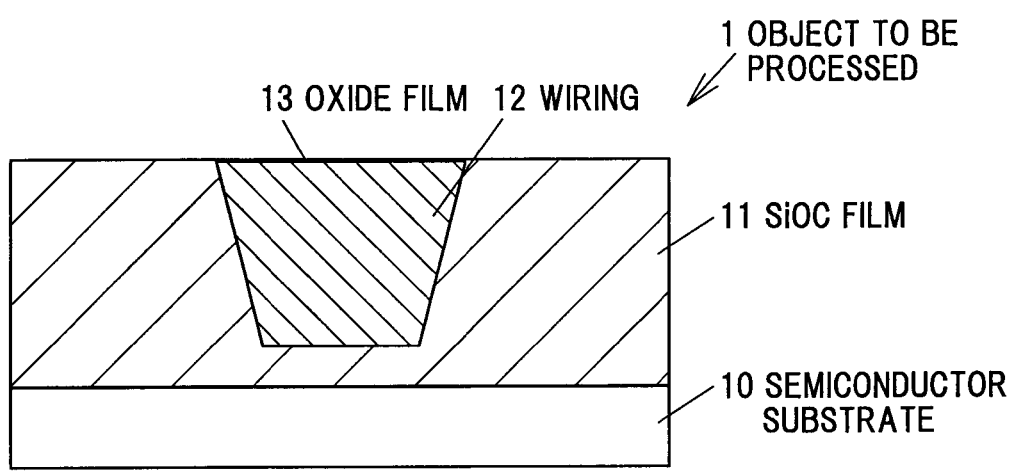
FIG. 1 is a transverse cross-sectional view schematically showing the primary portion of an object to be processed used in a method of manufacturing a semiconductor device according to a embodiment of the invention.

A method of manufacturing a semiconductor device according to the embodiment will be explained below referring to the drawings. First, an object to be processed is prepared.

FIG. 1 is a transverse cross-sectional view schematically showing the primary portion of an object to be processed used in a method of manufacturing a semiconductor device according to the embodiment of the invention. The object to be processed 1 roughly includes, for example, as shown in FIG. 1, a semiconductor substrate 10 formed of a Si based substrate containing Si as a main component, a SiOC film 11 (First insulating film) of a porous insulating film formed on the semiconductor substrate 10, and a wiring 12 of a Cu wiring containing Cu as a main component. Further, a semiconductor element such as a transistor is formed on the semiconductor substrate 10, and a plug and the like for electrically connecting the wiring 12 to semiconductor element are formed on the SiOC film 11, although they are omitted to be shown in drawings. Also, a barrier metal film for preventing Cu contained in the wiring 12 from diffusing into the SiOC film 11 is formed around the wiring 12.

Particularly, first, the SiOC film 11 is formed on the semiconductor substrate 10 by, for example, a Chemical Vapor Deposition (CVD) method. Subsequently, a groove for forming the wiring 12 is formed in the SiOC film 11 by, for example, a photolithography method and a Reactive Ion Etching (RIE) method, and a metal film is embedded in the groove by, for example, a plating method. Subsequently, the metal film formed on the SiOC film 11 is removed by the CMP method so as to obtain the object to be processed 1 in which the wiring 12 is formed on the SiOC film 11.

Here, an oxide film 13 is a film that is formed by that, for example, the exposed surface of the wiring 12 is oxidized by being atmospherically-exposed after the wiring 12 is embedded and formed in the surface of the SiOC film 11 by the CMP process or the like.

FIG. 2 is a transverse cross-sectional view schematically showing the primary portion of a PECVD (Plasma-Enhanced Chemical Vapor Deposition) device used in the method of manufacturing a semiconductor device according to the embodiment of the invention. Each process described below is applied to the object to be processed 1 in a processing chamber 20 of the PECVD device 2.

The PECVD device 2 roughly includes, for example, as shown in FIG. 2, the processing chamber 20, a gas inlet-cum-upper electrode 22 and a heater-cum-lower electrode 23.

Next, a SiCN film 31 is formed on the inner wall 21 of the processing chamber 20 as a protective film. Particularly, in a state that the object to be processed 1 is not housed in the processing chamber 20, a mixed gas of 3MS(Tri-Methyl-Silane), $NH_3$ and $N_2$ is introduced into the processing chamber 20 from the gas inlet-cum-upper electrode 22 and a pressure in the processing chamber 20 is maintained to 7 Torr. The feeding speed of 3MS(Tri-Methyl-Silane), $NH_3$ and $N_2$ is respectively set to 400 sccm, 200 sccm, and 2000 sccm. Subsequently, high-frequency electricity of 600 W and 13,56 MHz is applied between the gas inlet-cum-upper electrode 22 and the heater-cum-lower electrode 23, so as to generate a plasma of TMS(Tri-Methyl-Silane), $NH_3$ and $N_2$ and form the SiCN film 31 on the inner wall 21 of the processing chamber 20.

Further, the protective film formed on the inner wall 21 of the processing chamber 20 can be an insulating film or the like including, for example, at least one of a SiN film, a SiC film and a BN film, instead of the SiCN film 31.

Next, the object to be processed 1 is mounted on the heater-cum-lower electrode 23 of the PECVD device 2 and the inside of processing chamber 20 is kept in a high-vacuum state as a predetermined atmosphere.

FIGS. 3A to 3E are cross-sectional views schematically and respectively showing the primary portion of manufacturing processes of a method of manufacturing a semiconductor device according to the embodiment of the invention.

Figure 3A:
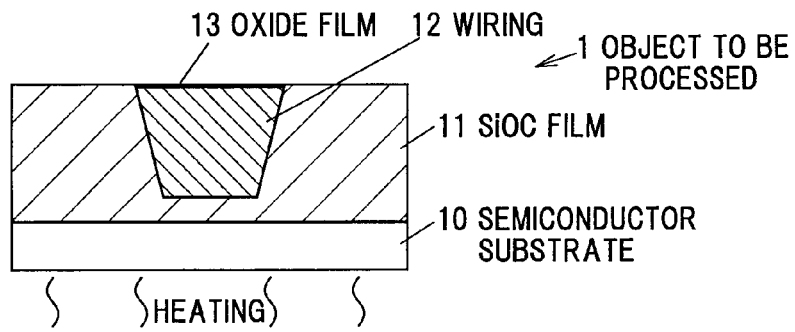
FIGS. 3A to 3E are cross-sectional views schematically and respectively showing the primary portion of manufacturing processes of a method of manufacturing a semiconductor device according to the embodiment of the invention.

Next, as shown in FIG. 3A, the object to be processed 1 is heated by the heater-cum-lower electrode 23.

Figure 3B:
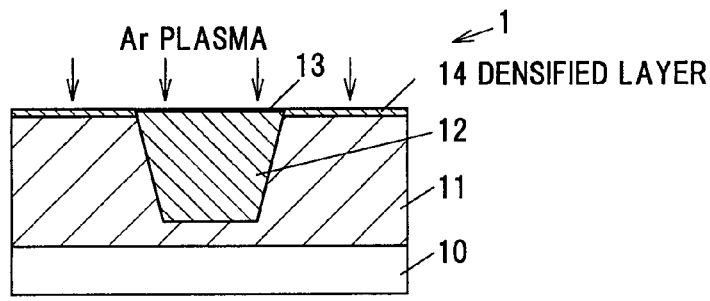

Next, as shown in FIG. 3B, the object to be processed 1 is exposed to a plasma containing a rare gas or a mixed gas of the rare gas and $N_2$ gas, so as to form a densified layer 14 on the surface of the SiOC film 11. Particularly, Ar gas as the rare gas is introduced into the processing chamber 20 from the gas inlet-cum-upper electrode 22, and the high-frequency electricity is applied between the gas inlet-cum-upper electrode 22 and the heater-cum-lower electrode 23, so as to generate an Ar plasma in the processing chamber 20, and the object to be processed 1 is exposed to the generated Ar plasma for 5 seconds. The surface of the SiOC film 11 is exposed to the Ar plasma so that the densified layer 14 is formed thereon. Subsequently, the application of the high-frequency electricity and the introduction of the Ar gas are disconnected.

Here, the densified layer 14 is formed by that the surface of the SiOC film 11 is densified by that the Ar ions generated by the Ar plasma collide with the surface of the SOC film 11 and simultaneously the SiCN film 31 of a protective film of the inner wall 21 is sputtered by the Ar plasma so that the sputtered SiCN adheres to the surface of the SiOC film 11. The densified layer 14 prevents $NH_3$ ions and radicals generated by a $NH_3/N_2$ plasma from invading the SiOC film 11, the $NH_3/N_2$ plasma being used at a process of removing the oxide film 13 described below. And, the densified layer 14 has a thickness of preferably not more than 20 nm and more preferably 3 to 10 nm.

Further, the rare gas used in the process of exposing the plasma can be a gas containing at least one of He, Ar, Ne and Xe. Also, in case of the Cu wiring, when the SiN film or the SiCN film is used as a diffusion-preventing layer 15 described below, a plasma processing containing a $N_2$ gas that is capable of carrying out the densification process of the SiOC film 11 and a nitriding process of the surface of the Cu wiring simultaneously is preferable in terms of adhesion between the Cu wiring and the diffusion-preventing layer 15.

Figure 3C:
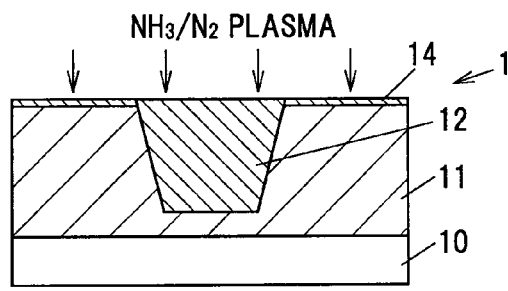

Next, as shown in FIG. 3C, the oxide film 13 formed on the surface of the wiring 12 is removed. Particularly, a mixed gas of $NH_3$ and $N_2$ is introduced into the processing chamber 20 from the gas inlet-cum-upper electrode 22, and the high-frequency electricity is applied between the gas inlet-cum-upper electrode 22 and the heater-cum-lower electrode 23, so as to generate a $NH_3/N_2$ plasma in the processing chamber 20. The oxide film 13 is removed by the reduction reaction due to the $NH_3/N_2$ plasma (Third plasma).

Further, the process of removing the oxide film 13 can be a process that it is exposed to a gas containing at least one of $NH_3$, $H_2$ and CO which are activated by a plasma processing or heating. The heating temperature is, for example, 150 to 400 degrees C. The process is not limited to the above-mentioned example, but a mixed gas of a reducing gas such as $H_2$ or CO instead of $NH_3$ gas and a rare gas such as He, Ne, Xe can be used if the oxide film 13 can be removed. Further, if the oxide film 13 can be removed, an activated reducing gas flow process, the reducing gas being activated by that a plasma discharge is carried out outside the processing chamber 20, can be used, and a not-activated reducing gas flow process can be also used.

Figure 3D:
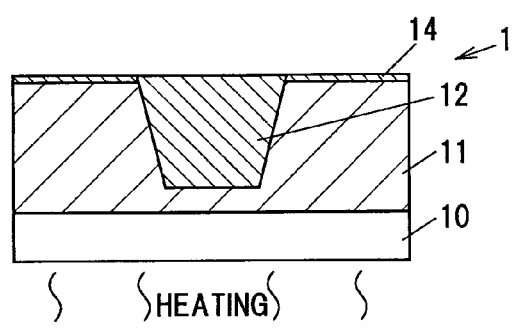

Next, as shown in FIG. 3D, the object to be processed 1 is heated by the heater-cum-lower electrode 23.

Figure 3E:
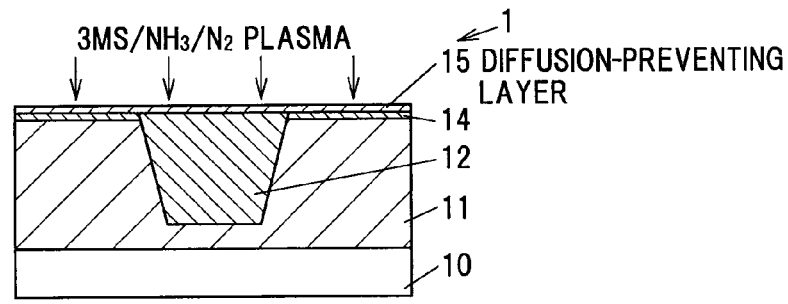

Next, as shown in FIG.3E, the diffusion-preventing layer 15 is formed as a second insulating film on the wiring 12 where the oxide film 13 is removed and the densified layer 14. The process of forming the diffusion-preventing layer 15 is carried out by that a plasma(Second plasma) of 3MS(Tri-Methyl-Silane), $NH_3$ and $N_2$ is generated in the processing chamber 20 under conditions equal to the conditions used for forming the SiCN film 31 on the inner wall 21, so as to form the diffusion-preventing layer 15 formed of the SiCN film. Here, if the oxide film 13 of the wiring 12 is removed by exposing the wiring 12 to the $NH_3/N_2$ plasma before this, it is only needed to additionally introduce the 3MS(Tri-Methyl-Silane) into the processing chamber 20 at the time of forming the diffusion-preventing layer 15, so that it has an advantage in terms of throughput.

Further, an insulating film is formed as a protective film of the inner wall 21 of the processing chamber 20 in terms of preventing leakage between the wirings, in this case, it is preferable that the insulating film is formed of a film not containing oxygen in terms of preventing the surface of the wiring 12 from being oxidized. Also, it is preferable that the film has a composition similar to that of the diffusion-preventing layer 15 in terms of adhesion between the wiring 12 and the SiOC film 11, and the diffusion-preventing layer 15.

Next, predetermined processes for manufacturing a desired semiconductor device are passed through, so as to obtain the semiconductor device.

Further, here, such a case that the processes shown in FIGS. 3A to 3E are continuously carried out in the processing chamber 20 in a high-vacuum state has been explained, but not limited to this, it can be also adopted that processes at least from the process of removing the oxide film 13 as shown in FIG. 3C to the process of forming the diffusion-preventing layer 15 as shown in FIG. 3E are continuously carried out in the above-mentioned atmosphere without being atmospherically-exposed.

(Advantages of the Embodiment)

According to a method of manufacturing a semiconductor device of the embodiment, the following advantages can be obtained.

(1) The densified layer 14 is formed on the surface of the SiOC film 11 so that the properties of SiOC film 11 can be prevented from being changed at the time of removing the oxide film 13 of the surface of the wiring 12, and deterioration of adhesion between the SiOC film 11 and the diffusion-preventing layer 15 and increases in capacitance between wirings and in leakage current can be prevented.

(2) Processes from the process of removing the oxide film 13 to the process of forming the diffusion-preventing layer 15, or processes from the process of forming the densified layer 14 to the process of forming the diffusion-preventing layer 15 via the process of removing the oxide film 13 are carried out in the same processing chamber 20 so that each process can be carried out without being atmospherically-exposed, and yield ratio and throughput can be enhanced. Also, particles or the like which generate in accordance with travelling between processes can be prevented from adhering to the semiconductor device.

(3) The SiOC film 11 having a composition similar to that of the diffusion-preventing layer 15 is formed on the inner wall 21 of the processing chamber 20, and the SiCN sputtered by the Ar plasma used at the densification of the SiOC film 11 is deposited on the SiOC film 11, so that the densified layer 14 further capable of preventing the SiOC film 11 from being changed in properties thereof can be formed and adhesion to diffusion-preventing layer 15 can be enhanced.

EXAMPLE

Figure 4A:
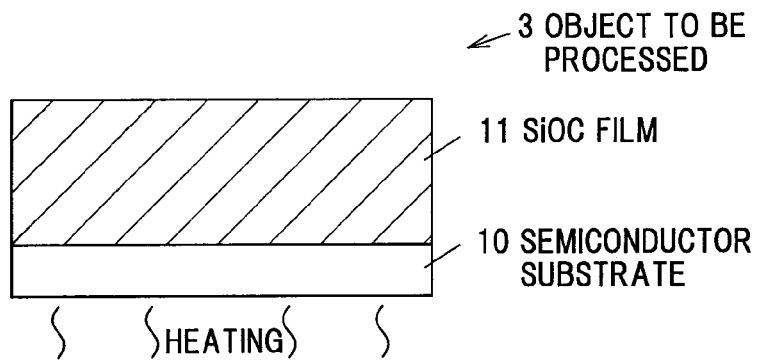
FIGS. 4A to 4C are transverse cross-sectional views schematically and respectively showing the primary portion of objects to be processed used in a method of manufacturing a semiconductor device according to Example of the invention.
Figure 4B:
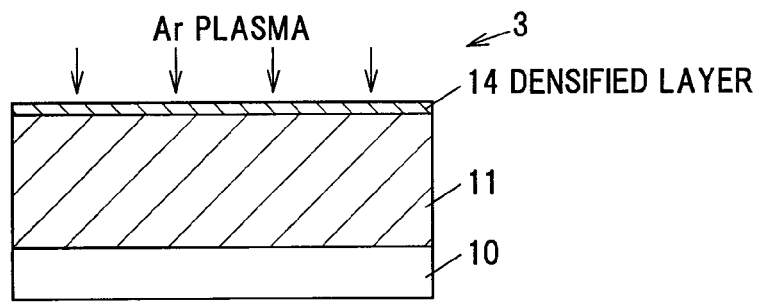
Figure 4C:
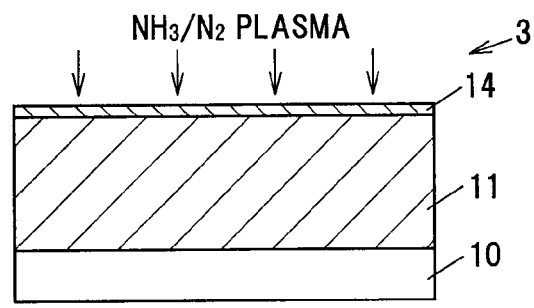

FIGS. 4A to 4C are transverse cross-sectional views schematically and respectively showing the primary portion of objects to be processed used in a method of manufacturing a semiconductor device according to Example of the invention. Hereinafter, an evaluation about change in film properties is carried out by that an object to be processed 3 of Example and an object to be processed 4 of Comparative Example that where the SiOC film 11 of 100 nm in thickness and 2.6 in relative dielectric constant is formed on the semiconductor substrate 10 are prepared, processes up to a process of exposing to the $NH_3/N_2$ plasma corresponding to a process of removing the oxide film 13 are carried out, and then a C concentration of each SiOC film 11 is measured. Further, as the protective film on the inner wall 21 of the processing chamber 20, the SiCN film is used, the SiCN film being formed under the same conditions as those under which the protective film is formed in the embodiment.

First, as shown in FIG. 4A, the object to be processed 3 is mounted on the heater-cum-lower electrode 23, a pressure in the processing chamber 20 is maintained in a high-vacuum state of not more than 10 Torr, and the heating is carried out by the heater-cum-lower electrode 23 so that the temperature of the object to be processed 3 becomes 350 to 400 degrees C.

Next, an Ar gas is introduced into the processing chamber 20 from the gas inlet-cum-upper electrode 22, and the pressure in the processing chamber 20 is maintained to 5 Torr. The feeding speed of the Ar gas is set to 1000 sccm.

Next, as shown in FIG. 4B, high-frequency electricity of 500 W and 13.56 MHz is applied between the gas inlet-cum-upper electrode 22 and the heater-cum-lower electrode 23, so as to generate the Ar plasma in the processing chamber 20, and the object to be processed 3 is exposed to the generated Ar plasma for 5 seconds so as to carry out the plasma processing, and further the densified layer 14 is formed on the surface of the SiOC film 11. The densified layer 14 has a thickness of almost 10 nm. Subsequently, the application of the high-frequency electricity and the introduction of the Ar gas are disconnected.

Next, a mixed gas of $NH_3$ and $N_2$ is introduced into the processing chamber 20 from the gas inlet-cum-upper electrode 22, and the pressure in the processing chamber 20 is maintained to 5 Torr. The feeding speed of the mixed gas is set to 2000 sccm.

Next, as shown in FIG. 4C, high-frequency electricity of 200 W and 13.56 MHz is applied between the gas inlet-cum-upper electrode 22 and the heater-cum-lower electrode 23, so as to generate the $NH_3/N_2$ plasma in the processing chamber 20, and the object to be processed 3 is exposed to the generated $NH_3/N_2$ plasma for 30 seconds so as to carryout the plasma processing.

[Comparative Example]

FIGS. 5A and 5B are transverse cross-sectional views schematically and respectively showing the primary portion of objects to be processed used in a method of manufacturing a semiconductor device according to Comparative Example.

First, as shown in FIG. 5A, an object to be processed 4 is heated under the same conditions as those in Example.

Next, without carrying out the Ar plasma processing which is carried out in Example, a mixed gas of $NH_3$ and $N_2$ is introduced into the processing chamber 20 under the same conditions as those in Example.

Next, as shown in FIG. 5B, the plasma processing by the $NH_3/N_2$ plasma is carried out under the same conditions as those in Example.

[Evaluation]

With regard to the SiOC films 11 of the objects to be processed 3, 4 which have passed through the above-mentioned processes, profiles of the relative dielectric constant and the C concentration due to a Secondary Ion-microprobe Mass Spectrometer (SIMS) analysis are measured, so as to carry out an evaluation about change in film properties. Also, as Reference Example, an object to be processed where a SiOC film of 2.6 in relative dielectric constant is formed on a semiconductor substrate is prepared similarly to Example and Comparative Example, and the profile of the C concentration is measured.

Figure 6:
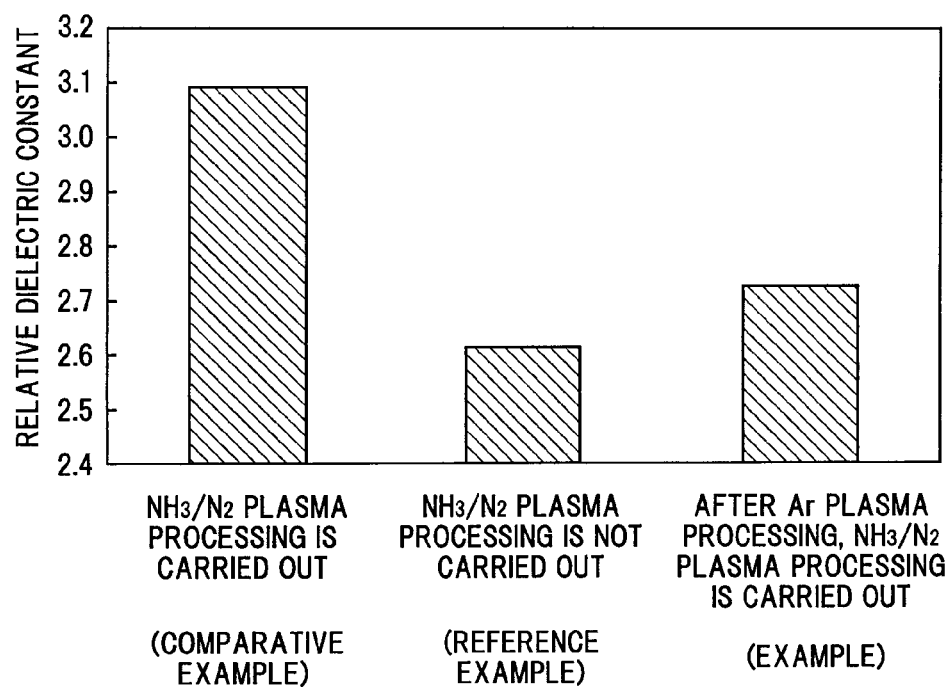
FIG. 6 is a graph schematically showing a relationship between relative dielectric constant and plasma processing in Example, Comparative Example and Reference Example.

FIG. 6 is a graph schematically showing a relationship between relative dielectric constant and plasma processing in Example, Comparative Example and Reference Example. The horizontal axis shows a case that "$NH_3/N_2$ plasma processing is carried out" corresponding to Comparative Example, a case that "$NH_3/N_2$ plasma processing is not carried out" corresponding to Reference Example, and a case that "after Ar plasma processing, $NH_3/N_2$ plasma processing is carried out" corresponding to Example, and the vertical axis shows the respective relative dielectric constants.

As a result of measurement, the relative dielectric constant of Comparative Example is almost 3.1, and the value is extremely increased in comparison with 2.6 of the relative dielectric constant in Reference Example.

On the other hand, the relative dielectric constant of Example is almost 2.7, although the value is increased in comparison with the relative dielectric constant in Reference Example, it is smaller than the relative dielectric constant in Comparative Example, and it is understood that increase in relative dielectric constant is prevented in comparison with Comparative Example.

Figure 7:
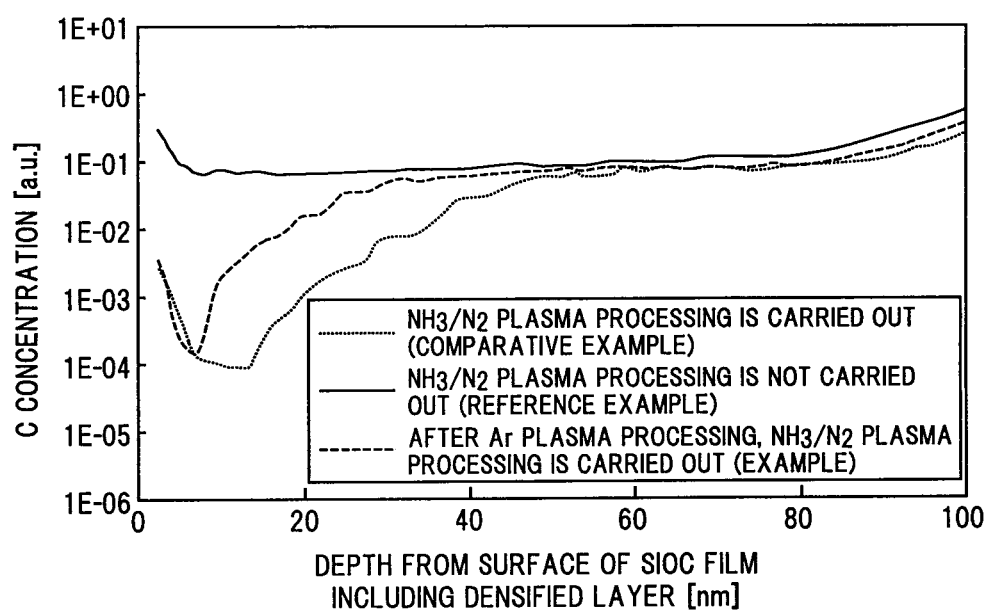
FIG. 7 is a graph schematically showing a relationship between depth from surface of SiOC film including densified layer and C concentration.

FIG. 7 is a graph schematically showing a relationship between depth from surface of SiOC film including densified layer and C concentration. The horizontal axis shows the depth (nm) from the surface of the SiOC film including the densified layer, and the vertical axis shows the C concentration (a.u.).

As a result of measurement, in case of Comparative Example, as shown in FIG. 7, the C concentration from the surface of the SiOC film 11 to the depth of almost 0 to 50 nm is lowered in comparison with Reference Example. This shows that the C concentration has been lowered mainly due to breaking of Si—$CH_3$ bonds in the SiOC film 11.

On the other hand, in case of Example, as shown in FIG. 7, the C concentration from the surface of the SiOC film 11 to the depth of almost 0 to 30 nm is lowered in comparison with Reference Example, although particularly, the C concentration adjacent to the topmost surface is transiently lowered, the subsequent lowering is smaller than Comparative Example. This shows that the lowering of C concentration is prevented in a region whose depth from the surface of the SiOC film 11 is shallow. Namely, it is understood that since the densified layer 14 is capable of preventing the change in film properties and the thickness of the densified layer 14 is almost 10 nm, the lowering of C concentration is prevented in a region deeper than the densified layer 14.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, the plasma processing time due to the Ar plasma is 5 sec, but not limited to this, if an effect of preventing the change in film properties of the SiOC film 11 due to the $NH_3/N_2$ plasma processing can be obtained. However, since there is a possibility that the SiOC film 11 is changed in film properties thereof by the plasma processing for densification, it is preferable that the Ar plasma processing time is shorter than that of the $NH_3/N_2$ plasma processing.

In addition, the SiOC film 11 in mentioned above can be, for example, a porous insulating film such as a Hydrogen Silsesquioxane (HSQ) film, a Methyl Silsesquioxane (MSQ) film.

What is claimed is:

1. A method of manufacturing a semiconductor device, comprising:
    forming a wiring within a first insulating film on a semiconductor substrate;
    exposing the first insulating film to a first plasma containing a rare gas inside a processing chamber so as to form a densified layer on an upper surface of the first insulating film;
    removing an oxide film formed on the wiring, after the densified layer is formed;
    forming a second insulating film on the wiring from which the oxide film is removed and on the densified layer by a second plasma containing 3MS, $NH_3$ and $N_2$; and
    forming a third insulating film on inner walls of the processing chamber selected from a group consisting of SiN film, SiCN film, SiC film, and BN film before exposing the first insulating film to the first plasma,
    wherein the densified layer is formed by allowing ions generated by the plasma to collide with the upper surface of the first insulating film and by sputtering the third insulating film by the first plasma to allow the sputtered third insulating film to adhere to the upper surface of the first insulating film, and
    wherein processes from formation of the densified layer to formation of the second insulating film are carried out without being atmospherically exposed.

2. The method of manufacturing a semiconductor device according to claim 1, wherein the rare gas includes at least one element selected from the group consisting of He, Ar, Ne and Xe.

3. The method of manufacturing a semiconductor device according to claim 1, wherein the oxide film is removed by exposing the wiring to a gas containing at least one gas selected from the group consisting of $NH_3$, $H_2$ and CO that are activated by a third plasma or heating.

4. The method of manufacturing a semiconductor device according to claim 1, wherein the first insulating film is formed of a SiOC film.

5. The method of manufacturing a semiconductor device according to claim 1, wherein the wiring is a Cu wiring.

6. The method of manufacturing a semiconductor device according to claim 1, wherein the oxide film is removed by carrying out a not-activated reducing gas flow process.

* * * * *